(12) United States Patent
Ramirez

(10) Patent No.: US 9,097,746 B2
(45) Date of Patent: Aug. 4, 2015

(54) ELECTRONIC TAMPER DETECTION IN A UTILITY METER USING MAGNETICS

(75) Inventor: Anibal Diego Ramirez, Indianapolis, IN (US)

(73) Assignee: Landis+Gyr, Inc., Lafayette, IN (US)

( * ) Notice: Subject to any disclaimer, the term of this patent is extended or adjusted under 35 U.S.C. 154(b) by 343 days.

(21) Appl. No.: 13/225,154

(22) Filed: Sep. 2, 2011

(65) Prior Publication Data

US 2012/0074927 A1 Mar. 29, 2012

Related U.S. Application Data

(60) Provisional application No. 61/379,557, filed on Sep. 2, 2010.

(51) Int. Cl.
*G01R 11/24* (2006.01)
*G01R 22/06* (2006.01)

(52) U.S. Cl.
CPC .................................. *G01R 22/066* (2013.01)

(58) Field of Classification Search
CPC .... G01R 22/066; G01R 22/068; G01R 11/24; G01R 11/25; G08B 13/08; H01H 36/0046; G01D 11/24–11/26
USPC ............. 324/110, 142, 156; 340/551, 870.02, 340/547; 200/61.93; 361/641, 654, 659, 361/672
See application file for complete search history.

(56) References Cited

U.S. PATENT DOCUMENTS

| 3,522,596 | A | * | 8/1970 | Fowler et al. | 137/554 |
|---|---|---|---|---|---|
| 3,896,427 | A | * | 7/1975 | Campman | 340/540 |
| 4,438,430 | A | * | 3/1984 | Young et al. | 340/547 |
| 4,484,041 | A | * | 11/1984 | Andres et al. | 200/61.45 M |
| 4,700,163 | A | * | 10/1987 | Wolfe, Jr. | 335/205 |
| 4,908,605 | A | * | 3/1990 | Takatsuka | 340/542 |
| 5,473,504 | A | * | 12/1995 | Horan et al. | 361/667 |
| 5,503,271 | A | * | 4/1996 | Lynch | 206/305 |
| 5,777,552 | A | * | 7/1998 | Fischette et al. | 340/547 |
| 6,774,807 | B1 | * | 8/2004 | Lehfeldt et al. | 340/686.1 |
| 6,885,185 | B1 | * | 4/2005 | Makinson et al. | 324/142 |
| 7,189,109 | B2 | * | 3/2007 | Robinson | 439/517 |
| 7,372,349 | B2 | * | 5/2008 | Wheeler et al. | 335/78 |
| 2002/0033759 | A1 | * | 3/2002 | Morello | 340/605 |
| 2011/0057788 | A1 | * | 3/2011 | Talkington et al. | 340/521 |

* cited by examiner

*Primary Examiner* — Huy Q Phan
*Assistant Examiner* — James Split
(74) *Attorney, Agent, or Firm* — Maginot, Moore & Beck LLP

(57) ABSTRACT

An arrangement for use in a utility meter includes a switch, a processing circuit, and a magnetic element. The switch is supported on a first meter structure. The switch has at least a first and second state. The switch is configured to transition from a first state to a second state responsive to a detected magnetic field of a first polarity, and to transition from a second state to a first state responsive to a detected magnetic field of a second polarity. The processing circuit is operably coupled to determine whether the switch is in the first state or the second state. The magnetic element is supported on a second meter structure configured to be physically connected to the first meter structure, the magnetic element positioned such that removal of the second meter structure from the first meter structure causes the magnetic element to expose the switch to a magnetic field of the first polarity.

20 Claims, 4 Drawing Sheets

ELECTRONIC TAMPER DETECTION IN A UTILITY METER USING MAGNETICS

This application claims the benefit of U.S. Provisional Patent Application Ser. No. 61/379,557, filed Sep. 2, 2010, which is incorporated herein by reference.

FIELD OF THE INVENTION

This invention relates generally to tamper detection in utility meters.

BACKGROUND OF THE INVENTION

There is a need for devices that detect tampering with utility meters. Tampering with utility meters can cause damage to equipment, serious injury, and loss of revenue. Meter tampering typically involves opening the sealed meter cover to either disable the counting/registration device or to divert a resource (such as water or electricity). By diverting the resource past the meter (i.e. bypassing the meter), the resource may be consumed without recordation or registration for billing purposes.

While meters are crafted in a way such that opening the meter cover is difficult, it is not practical or likely possible to create a meter cover that cannot be removed. Indeed, at least one consideration is that meter technician may be required to open the meter cover at some point. Therefore the meter closure cannot be impenetrable. Accordingly, a main strategy in tamper protection is to detect and flag a tamper event. Because meters are periodically read, either in person or remotely, the flagging of a meter tamper event allows for relatively timely indication that tampering has occurred. Upon receiving evidence of a tamper event, the situation can be corrected.

Traditionally, mechanical seals have been placed between the meter base assembly and its cover to inhibit unauthorized access. In such cases, a broken seal can indicate a tamper event. This protection mechanism, although sufficient on meters employing primary mechanical counters, may not provide adequate protection for electronic meters. In particular, electronic meters can often be read remotely, or at least without close inspection of the meter. Accordingly, if an electronic meter has the ability to report metering data remotely, there may seldom be an opportunity for a meter technician to observe a broken seal at the location of the meter.

One possible approach to tamper detection would be to place a position sensor on the meter cover. In particular, as is known in the art, electronic meters typically include processing circuitry. Such processing circuitry could record any movement of position of the sensor. However, this solution would only be effective when the meter is powered, since the position sensor circuits would otherwise lack bias power. Conceivably, a thief could tamper with the meter during a power outage without detection. If the thief replaced the meter cover before power is restored, the position sensor would never detect an issue.

There is a need, therefore, for improved electronic tamper detection that operates in the absence of meter power, and does not require, or at least rely exclusively on, a mechanical seal.

SUMMARY OF THE INVENTION

At least some embodiments of the present invention address the above described need, as well as others, by providing an arrangement that includes a bi-stable magnetic switch and a magnet that are arranged such that the switch is triggered by removal of the meter cover, even if power is removed from the meter circuitry. After any power interruption, the meter processing circuits upon restoration can detect the triggering of the switch, indicating tampering.

Accordingly, a first embodiment is an arrangement for use in a utility meter that includes a switch, a processing circuit, and a magnetic element. The switch is supported on a first meter structure. The switch has at least a first and second state. The switch is configured to transition from a first state to a second state responsive to a detected magnetic field of a first polarity, and to transition from a second state to a first state responsive to a detected magnetic field of a second polarity. The processing circuit is operably coupled to determine whether the switch is in the first state or the second state. The magnetic element is supported on a second meter structure configured to be physically connected to the first meter structure, the magnetic element positioned such that removal of the second meter structure from the first meter structure causes the magnetic element to expose the switch to a magnetic field of the first polarity.

The above described features and advantages, as well as others, will become more readily apparent to those of ordinary skill in the art by reference to the following detailed description and accompanying drawings.

DETAILED DESCRIPTION

Figure 1:
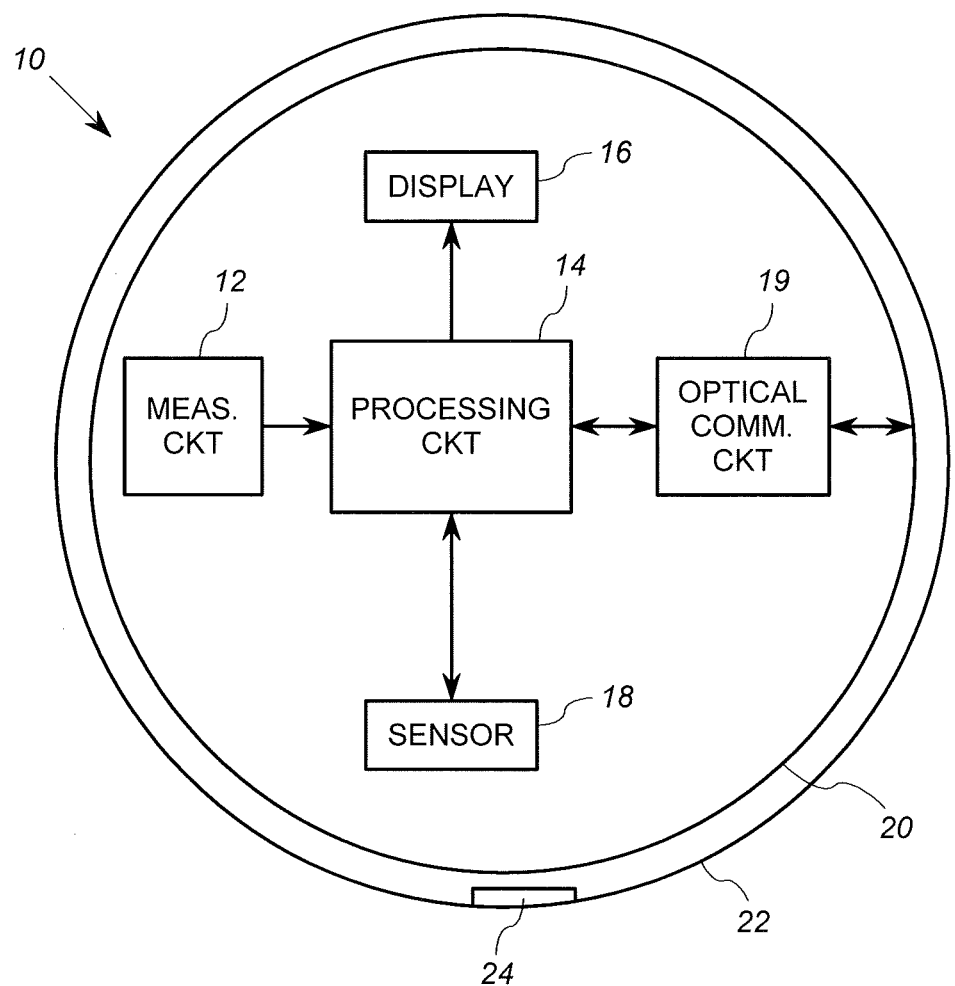
FIG. 1 shows a schematic block diagram of an exemplary electricity meter 10 that incorporates an arrangement for detection according to the invention.

FIG. 1 shows an exemplary electricity meter 10 that incorporates an arrangement for detection according to the invention. The electricity meter 10 includes measurement circuitry 12, a processing circuit 14, a display 16, a sensor 18 and optical communication circuitry 19, all disposed on or supported by or within a structure 20. The meter 10 also includes a cover 22 having an embedded magnet 24.

The measurement circuit 12 includes voltage and/or current sensors, analog to digital conversion circuitry, and other circuitry configured to generate digital measurement and/or energy signals from power lines, not shown. Such circuits for electronic meters are well known in the art. The processing circuit 14 is a circuit that performs control functions with the meter 10, and in many cases performs further processing on the digital measurement signals generated by the measurement circuit 12. For example, the processing circuit 14 may convert raw digital measurement information into a format that is displayable, or convert energy information to derivative types of energy consumption information, such as those related to time-of-use metering and/or demand metering which are known in the art. In another embodiment, the meter 10 includes a remote communication circuit, as is known in the art, and the processing circuit 14 would communicate metering data to a remote location via such a communication circuit. It will be appreciated that the exact physical configuration of the measurement circuit 12 and the processing circuit 14 is not important to the implementation of the invention, and this embodiment of the invention may be used in a wide variety of meters that include digital processing circuitry. While the processing circuit 14 includes the specific additional functionality related to tamper detection described herein, it may otherwise include known processing circuit structures and functionalities. Suitable embodiments of the measurement circuit 12 and such a processing circuit are described, for example, in U.S. patent application Ser. No. 12/777,244 filed May 10, 2010, Ser. No. 12/537,885, filed Aug. 7, 2009, and Ser. No. 12/652,007, filed Jan. 4, 2010, all of which are incorporated herein by reference.

The display 16 in this embodiment is an LCD display 16 that provides visible display of information as controlled by the processing circuit 14. Such display devices are known in the art and may take many forms.

The sensor 18 in this embodiment is a bi-stable magnetic switch. A bi-stable magnetic switch is a switch configured to controllably make or break an electrical connection, based on sensing a particular change in magnetic field. For example, a bi-stable magnetic switch may switch from an open to a closed position in the detection of a north magnetic field, and switch from a closed to an open position in the detection of a south magnetic field. Once in a particular position, the state of the switch does not change until the appropriate magnetic field is detected. Hence, it is bi-stable. In this embodiment, the processing circuit 14 is operably connected to determine whether the bi-stable switch sensor 18 is in an open position or closed position. Thus, the processing circuit 14 can determine whether the sensor 18 has detected a particular change in magnetic field. In this embodiment, the bi-stable magnetic switch is a reed switch. A suitable reed switch is the model R2E, Form E bi-stable magnetic surface mount reed switch available from Reed Relays and Electronics India Limited. Changes in polarity cause this device to change its state from open to closed or vice versa.

The structure 20 is a support structure for the meter 10 apart from the cover 22. The structure 20 may include on or more printed circuit boards, and includes the base portion of the meter 10 in this embodiment. (See FIG. 2). In general, when the meter cover 22 is removed from the meter, the structure 20 would be the physical support from which the meter cover 22 is removed.

Accordingly, the meter cover 22 is a physical structure that forms a protective cover over the electronic elements 12, 14, 16 and 18 supported by the structure 20. The meter cover 22 is at least partially transparent to allow reading of the display 16. In many cases, the cover 22 and the structure 20 include mating elements, not shown to facilitate securing the cover 22 onto the structure 20. Such mating elements typically require at least some rotation of the meter cover 22 after it has been placed on a corresponding portion of the structure 20. Meter covers that secure to a meter base via a rotational locking procedure are well known in the art.

In general, the meter cover 22 has final, installed (or fully closed) position and a plurality of non-final positions on the structure 20. The final position is associated with an installed and operating meter 10. In such a case, the meter cover 22 is fixed mated with the structure 20. For example, if the meter cover 22 is threaded, then the final position is when the meter cover 22 is fully rotated to its maximum extent (fully closed position) on the structure 20. In such a position, additional sealing elements may or may not be used to inhibit rotating the meter cover 22 in the opposite direction for the purposes of removal. An non-final position, as used herein, means any position of the meter cover 22 on the structure 20 that is not in the final position, such as, by way of non-limiting example, when the cover 22 is at any stage of rotation toward removal. To this end, FIG. 3, described further below, shows the meter 10 with the cover 22 in final position, and FIG. 4 shows the meter 10 with the cover in a non-final position.

The magnetic strip 24 is attached to an interior wall of the meter cover 22. The magnetic strip 24 is generally disposed such that any removal of the cover 22 will cause the magnetic strip 24 to pass by the sensor 18. To this end, the magnetic strip 24 is arranged in such a way as to pass through a position in which the magnetic strip 24 is aligned at least in part with the sensor 18 to as to cause the sensor 18 to change its state if it is in a first state, but not in a second state. For example, if the sensor 18 has a first state from which only a north polar magnetic field can change its state, and has a second state from which only a south polar magnetic field can change its state, the magnetic strip 24 is aligned such that removal of the meter cover 22 only causes one of the north or south polar magnetic fields to align with the sensor 18 sufficiently to switch the state of the sensor 18.

Figure 2:
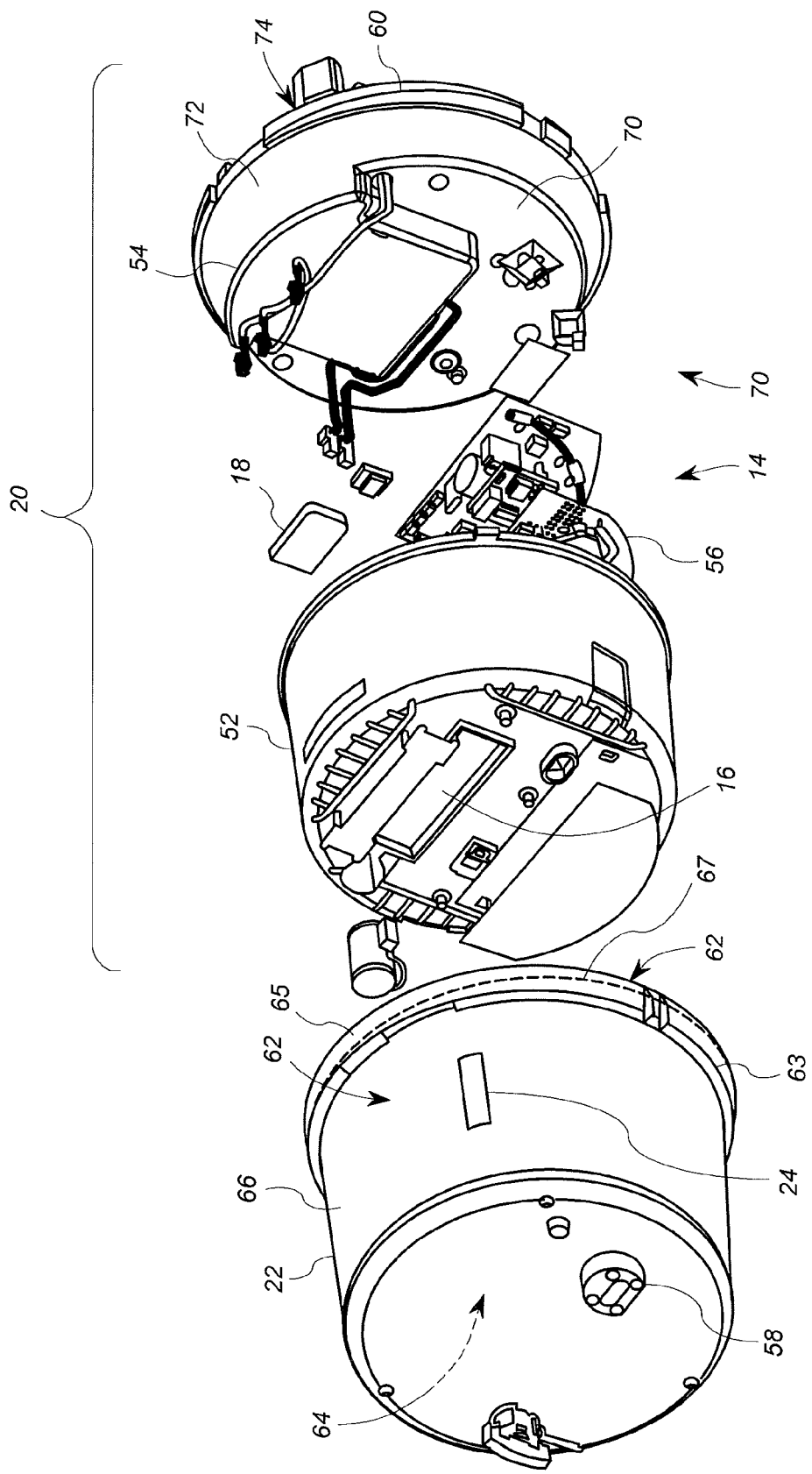
FIG. 2 shows an exploded perspective view of an exemplary embodiment of the meter of FIG. 1.
Figure 3:
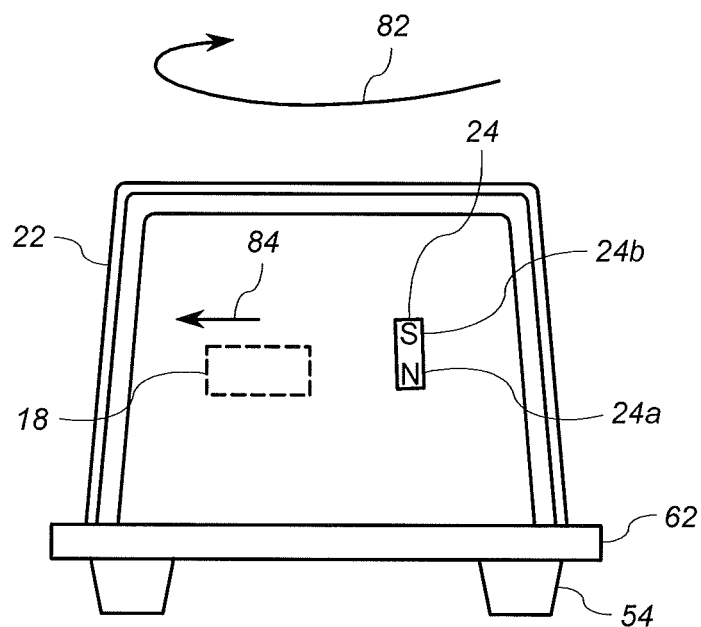
FIG. 3 shows a representative plan view of a meter in a final installed position.
Figure 4:
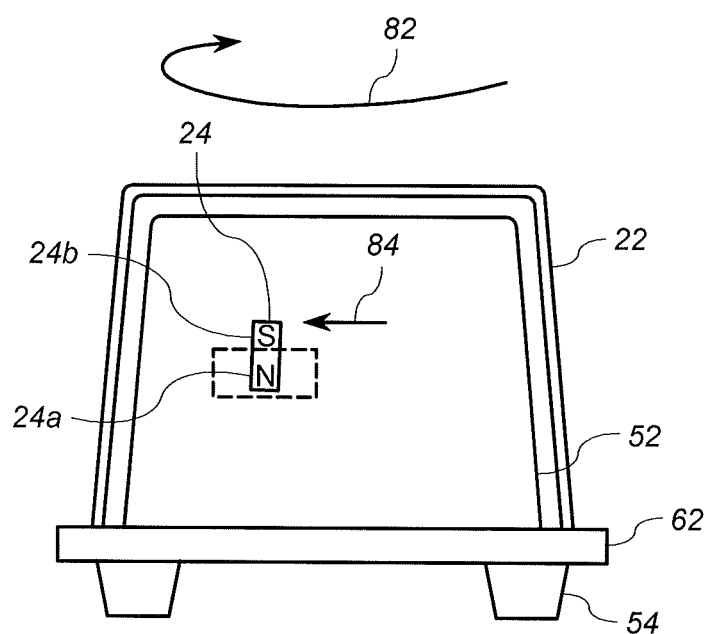
FIG. 4 shows a representative plan view of a meter in an uninstalled or non-final position.

FIGS. 2, 3 and 4 show in further detail an exemplary mechanical arrangement of the meter 10 of FIG. 1. FIG. 2 shows an exploded perspective view of a first embodiment of the meter 10, while FIGS. 3 and 4 show plan views of the meter 10 of FIG. 2 in different stages of removal of the cover 22.

As shown in FIG. 2, the meter cover 22 is a largely cylindrical (but slightly frustoconical), open bottom structure defining an interior 64 and having a main cylinder wall 66 and a bottom connecting portion 62. It will be appreciated that the cylinder wall 66 may also have a slightly tapered or frustoconical shape. The bottom connecting portion 62 includes an annular shelf 63 extending outward from an open end (i.e. bottom) of the main cylinder wall 66, and an annular skirt 65 continuing downward from an outer edge of the shelf 63. The annular skirt 65 includes a threaded interior surface 67. The threaded interior surface 67 has threading configured to rotatably engage corresponding threads 60 of the structure 20, as will be discussed further below. The meter cover 22 also includes an optical port lens structure 58 configured to provide an optical link from exterior of the meter 10 to the optical communication circuitry 19 which is disposed in the interior of the meter 10. In this embodiment, the meter cover 22 is transparent, and made from a polycarbonate material, which is known the art.

In this embodiment, the meter cover 22 includes a magnetic strip 24 having capable of exerting at least one magnetic field. The magnetic strip 24 is secured to the meter cover 22, such as by an adhesive, in a position such that it exerts a first magnetic field in a radially inward direction with respect to the cylindrical wall 66. Adhesive-coupled magnetic strips are known in the art. The magnetic strip 24 is disposed in a position such that it passes through the annular position of the sensor 18 when the threads 60, 67 are engaged and cover 22 is being rotated from a non-final position (or unsecured state) to the final position (or fully closed state). The magnetic strip 24 is further disposed such that it is not aligned with the annular position of the sensor when the cover 22 is fully rotated into the final position. Further detail regarding the placement of the magnetic strip 24 is provided below in connection with FIGS. 3 and 4.

The structure 20 includes an interior cover 52, a meter base 54, and a circuit board assembly 56. The interior cover 52 is also a largely cylindrical, open bottom structure defining an interior, not shown in FIG. 2, but which would be readily apparent to one of ordinary skill in the art. The interior cover 52 is sized to fit within the interior 64 of the meter cover 22, and is configured to be attached to the base 54.

The circuit board assembly 56 is disposed within the interior of the interior cover 52. The circuit board assembly 56 includes the processing circuit 14, some or all of the optical communication circuitry 19 and a portion of the measurement circuit 12. Elements of the measurement circuit 12, such as for example, current coils, current transformers, and meter blades, are disposed on the underside of the meter base 54, not shown. The interior cover 52 also supports the display 16.

The sensor 18, which in this embodiment is a bi-stable magnetic relay 18, such as a reed switch, is mounted within the interior of the interior cover 52 near a wall thereof. The bi-stable magnetic relay 18 should be mounted sufficiently close to the all of the interior cover 52 so as to allow the magnetic strip 24 to actuate the bi-stable magnetic relay 18 when the magnetic strip 24 is passed by the relay 18 from the exterior of the interior cover 52, assuming that relay 18 is in a state in which can be actuated by the magnetic field generated by magnetic strip 24. The bi-stable magnetic relay 18 may mounted to a circuit board of the circuit board assembly 56, mounted to the top surface of the base 54, or mounted to the interior wall of the interior cover 52. Of these options, it can be cost-effective to mount the relay 18 to one of the printed circuit board assemblies 56.

The meter base 54 includes a main plate 70, an annular side wall 72, and a lower annular skirt 74 having threads 60. The annular side wall 72 extends downward from the main plate 70, and the lower annular skirt 74 extends downward from the side wall 72, although the skirt 74 may include a portion that extends partly radially outward from the side wall 72 as well, as shown in FIG. 2. The annular skirt 74 and threads 60 are arranged such that the threaded portion 67 of the skirt 66 of the meter cover 22 engage threads 60. This engagement is such that, when the meter cover 22 is rotated in the proper direction, the threads 60 and 67 cooperate to secure the meter cover 22 to the meter base 54, and hence the structure 20. It will be appreciated that additional elements may be used to prevent or inhibit movement (i.e. secure the meter cover 22) once the meter cover 22 is in the final position.

The circuit board assembly 56 is secured to the main plate 70. As discussed above, current sensors and other devices, not shown, but which are known in the art, are mounted to the underside of the main plate 70.

FIGS. 3 and 4 show plan views of the exemplary meter 10 of FIG. 2 fully assembled. FIG. 3 shows the meter 10 in the fully installed position, that is, wherein the meter cover 22 is in its final resting place for ordinary ongoing meter operations. As shown in FIG. 3, the magnetic strip 24 in this case has first end 24a with a first polarity N and a second end 24b with a second polarity S. Also show in phantom format is the bi-stable magnetic relay 18, located within the interior cover 52, and which would not normally be visible in a plan view.

In the fully closed position of FIG. 3, at least the first end 24a of the magnetic strip 24 is axially aligned with (i.e. vertically on the same level as) the bi-stable magnetic relay 18. However, the magnetic strip 24 in not aligned with the annular or radial position with the bi-stable magnetic relay 18. In this position, the magnetic field of the first polarity N, generated at the first end 24a, will not activate the bi-stable magnetic relay 18.

It will further be appreciated that to remove the meter cover 22 from the base 54, the meter cover 22 must be rotated in the clockwise direction 82. When rotating in such direction, the magnetic strip 24 moves in the direction 84 towards (and ultimate past) the sensor 18.

FIG. 4 shows the meter 10 wherein the meter cover 22 has been partially rotated in the clockwise direction 82 as if to remove the meter cover 22. As a result of this rotation, the magnetic strip 24 moves such that at least the first end 24a is at least temporarily aligned radially with the bi-stable magnetic relay 18. As the magnetic strip 24 passes into and through this position, the magnetic field of the first polarity N at the first end 24a is configured to cause the bi-stable magnetic relay 18 to change its state, if the bi-stable magnetic relay 18 is currently in a state in which a magnetic field of polarity N could cause it to change. To this end, as noted above, the bi-stable magnetic relay 18 operates such that in a first state, only a magnetic field of a first polarity N can cause it to change states, and in a second state, only a magnetic field of a second polarity S can cause it to change states.

In operation of the first embodiment, when the meter cover 22 is inserted on to the structure 20 (rotated onto the base 54 via the threads 60, 67), the magnetic strip 24 passes the magnetic field of polarity N past the bi-stable magnetic relay 18. Thus, the bi-stable magnetic relay 18 will change to a bi-stable state in which it requires a polarity of S to cause it to change state. Once the meter cover 22 is installed, an external magnetic element having a polarity S, not shown, is passed over the bi-stable magnetic relay 18, such that it changes bi-stable state of the relay 18 such that it will only change state upon detection of a magnetic field having a polarity N. This may be done as one of the final manufacturing or commissioning steps for the meter 10, or any time after authorized service of the meter. In such condition, the meter 10 may then be installed in the field.

During normal operation, the processing circuit 10 detects the status of the bi-stable magnetic relay 18. Because the meter has most recently been exposed to the external magnet with a polarity S, the processing circuit 10 detects a corresponding status of the bi-stable switch, for example, closed. This is due to the fact that relay 18 is bi-stable and has not been exposed to a significant magnetic field N since the external magnet was passed over it.

If the meter 10 is tampered with, specifically, by removing the cover 22, then the magnetic strip 24 will pass over the bi-stable magnetic relay 18, as shown in FIG. 4. As a consequence, the bi-stable magnetic relay 18 is exposed to a magnetic field of polarity N. Specifically, the only practical way to non-destructively tamper with the interior operations of the meter 10 is to remove the cover 22 by rotating the cover 22 in the open direction 82. As shown in FIGS. 3 and 4, moving the cover 22 in the direction 82 causes the magnetic strip 24 to pass to its closest point to the bi-stable magnetic relay 18. Because the bi-stable magnetic relay 18 was last exposed to magnetic field of polarity S, the passing of the magnetic strip 24 will necessarily cause the sensor 18 to change its connectivity state. The processing circuit 14 detects this change and records a tamper event.

In response to detecting a tamper event, the processing circuit 14 may suitably cause a display of a tamper indicator or code on the meter display 16. In embodiments in which the processing circuit 14 is capable of remote communications, the processing circuit 14 can cause transmission of information indicating a tamper event to a remote device.

It will be appreciated that if the meter cover 20 is removed during a power outage, the tamper event is nevertheless recorded. Specifically, the bi-stable magnetic relay 18 operates to change states upon exposure to the N polarity magnetic field even in the absence of power to the meter 10. When the meter 10 regains power, the processing circuit 14 will detect that the status of the bi-stable magnetic relay 18 has changed, and records (and displays or communicates) a tamper event.

Accordingly, it will be appreciated that the above described arrangement allows for detection of a meter tampering event in an electronic meter, even when power is removed from the meter. Because the arrangement provides a detectable connection/signal to a digital processing circuit, the tamper detection flag may transmitted if the meter includes remote communication capability. In the embodiment described above, the tamper may also be communicated to an external device by the optical communication circuit 19.

It will be appreciated that in other embodiments, the magnetic strip (or other magnetic member) need not be of the bar magnet form, with opposite ends having opposite polarities. In particular, FIG. 2 shows a representative mechanical diagram of the structure 20, cover 22, sensor 18 and magnetic element 24' wherein the magnetic element 24' has opposing sides (as opposed to ends) with opposite magnetic polarity. The magnetic element 24' has a first magnetic polarity N that radially faces the general direction of the sensor 18, and a second magnetic polarity S that radially faces away from the general direction of the sensor 18. In such a case, the magnetic element 24' exposes only a single polarity magnetic field toward the interior of the meter 10.

Figure 5:
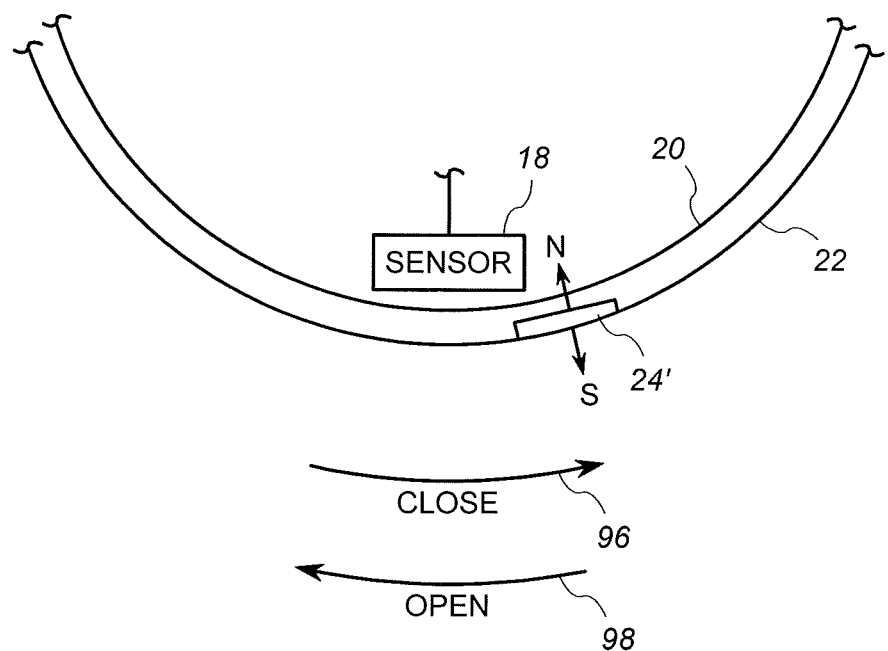
FIG. 5 shows a representative diagram of a portion meter illustrating an alternative embodiment.

As shown in FIG. 5, when the cover 22 is properly installed, the magnetic element 24' is further past the sensor 18 in the close direction 96. Thus, when the cover 22 is removed by rotating the cover 22 in the open direction 98, the magnetic element 24' necessarily traverses paste the sensor 18. The embodiment of FIG. 5 otherwise is configured and operates in the same manner as the embodiment of FIGS. 1-4.

The above describe embodiments are merely exemplary. Those of ordinary skill in the art may readily devise their own implementations and modifications that incorporate the principles of the present invention and fall within the spirit and scope thereof. For example, it will be appreciated that a similar technique may be employed in a water or gas meter, if such meter includes digital processing circuitry.

It will be appreciated that the magnetic strip 24 may be replaced with another type of magnetic device, so long as it is arranged such that only a predetermined polarity passes by bi-stable magnetic relay 18 upon removal of the cover 20. It will further be appreciated that the location of the magnetic strip 24 may be modified if the cover includes an alternative installation and removal means. In the case of a different installation technique, the strip 24 (or other magnetic device) should be arranged such that removal of the cover 20 necessarily causes the strip 24 to pass by the bi-stable magnetic relay 18.

What is claimed is:

1. An arrangement for use in a utility meter, comprising:
   a bi-stable magnetic switch supported on a first meter structure, the bi-stable magnetic switch having at least a first and second state;
   a processing circuit operably coupled to determine whether the bi-stable magnetic switch is in the first state or the second state;
   a magnetic element supported on a second meter structure configured to be physically connected to the first meter structure, the magnetic element positioned such that removal of the second meter structure from the first meter structure causes the magnetic element to move toward and past the bi-stable magnetic switch; and
   wherein the magnetic element is positioned such that relative movement of the second meter structure with respect to the first meter structure associated with installation and removal of the second meter structure exposes the bi-stable magnetic switch exclusively to a magnetic field of a first polarity.

2. The arrangement of claim 1, wherein the first meter structure includes a meter base and at least one printed circuit board.

3. The arrangement of claim 2, wherein the at least one printed circuit board is supported on the base.

4. The arrangement of claim 3, wherein the first meter structure includes an intermediate cover disposed between the at least one printed circuit board and the second meter structure.

5. The arrangement of claim 4, wherein the second meter structure includes a meter cover.

6. The arrangement of claim 1, wherein the second meter structure includes a meter cover.

7. The arrangement of claim 1, wherein the second meter structure includes a threaded portion configured to rotatably engage the first meter structure to at least partially secure the second meter structure thereto.

8. The arrangement of claim 7, wherein the magnetic element is substantially axially aligned with the bi-stable magnetic switch.

9. The arrangement of claim 8, wherein the second meter structure has a final position and a plurality of non-final positions on the first meter structure, and wherein the magnetic element is radially aligned with the bi-stable magnetic switch only when the second meter structure is in one of the plurality of non-final positions.

10. The arrangement of claim 1, wherein the magnetic element has a magnetic axis and the second meter structure has an axis of rotation, the magnetic axis being parallel to the axis of rotation.

11. The arrangement of claim 1, wherein exposing the bi-stable magnetic switch to the magnetic field of the first polarity causes the bi-stable magnetic switch to change states from the second state to the first state and the processing circuit is configured to determine a change of state from the second state to the first state.

12. An arrangement for use in a utility meter, comprising:
    a switch supported on a first meter structure, the switch having at least a first and second state, the switch configured to transition from the first state to the second state responsive to a detected magnetic field of a first polarity, and to transition from the second state to the first state responsive to a detected magnetic field of a second polarity;
    a processing circuit operably coupled to determine whether the switch is in the first state or the second state; and
    a magnetic element having a first pole and a second pole, the magnetic element supported on a second meter structure configured to be physically connected to the first meter structure, the magnetic element positioned such that the switch is more proximate the first pole than the second pole during an entire movement of the second meter structure associated with installation and removal of the second meter structure.

13. The arrangement of claim 12, wherein the first meter structure includes a meter base and at least one printed circuit board.

14. The arrangement of claim 13, wherein the at least one printed circuit board is supported on the base.

15. The arrangement of claim 14, wherein the first meter structure includes an intermediate cover disposed between the at least one printed circuit board and the second meter structure.

16. The arrangement of claim 15, wherein the second meter structure includes a meter cover.

17. The arrangement of claim 12, wherein the second meter structure includes a meter cover.

18. The arrangement of claim 12, wherein the second meter structure includes a threaded portion configured to rotatably engage the first meter structure to at least partially secure the second meter structure thereto.

19. The arrangement of claim 11, wherein the processing circuit is configured to record a tamper event responsive to determining the change of state from the second state to the first state.

20. The arrangement of claim 19, wherein the change of state occurs during a power outage.

\* \* \* \* \*